United States Patent [19]
DeCramer et al.

[11] Patent Number: 6,150,896
[45] Date of Patent: *Nov. 21, 2000

[54] COUPLING DEVICE CONNECTING AN UNBALANCED SIGNAL LINE TO A BALANCED SIGNAL LINE

[75] Inventors: John E. DeCramer, Marshall; Franklin Bradley Gass, Slayton, both of Minn.

[73] Assignee: BH Electronics, Inc., Burnsville, Minn.

[*] Notice: This patent is subject to a terminal disclaimer.

[21] Appl. No.: 08/862,763

[22] Filed: May 23, 1997

Related U.S. Application Data

[63] Continuation-in-part of application No. 08/574,494, Dec. 19, 1995, Pat. No. 5,633,614, which is a continuation of application No. 08/358,739, Dec. 19, 1994, Pat. No. 5,495, 212.

[51] Int. Cl.[7] ....................................................... H03H 7/42
[52] U.S. Cl. ................................................. 333/25; 333/32
[58] Field of Search ................................. 333/12, 25, 32; 343/859

[56] References Cited

U.S. PATENT DOCUMENTS

| | | |
|---|---|---|
| 1,812,624 | 6/1931 | Cummings . |
| 3,223,920 | 12/1965 | Sasaki . |
| 3,311,831 | 3/1967 | Leppert . |
| 3,352,966 | 11/1967 | Sawazaki et al. . |
| 4,037,177 | 7/1977 | Tyrey ........................................ 333/32 |
| 4,201,960 | 5/1980 | Skutta ..................................... 333/17.3 |
| 4,201,962 | 5/1980 | Hosoya ..................................... 333/25 |
| 4,670,874 | 6/1987 | Sato et al. ............................. 370/110.1 |
| 4,717,896 | 1/1988 | Graham ..................................... 333/25 |
| 4,766,402 | 8/1988 | Crane ...................................... 333/25 |
| 4,885,747 | 12/1989 | Foglia ..................................... 370/123 |
| 5,010,399 | 4/1991 | Goodman et al. ......................... 358/85 |
| 5,027,426 | 6/1991 | Chiocca, Jr. ................................ 455/5 |
| 5,126,702 | 6/1992 | Gris ....................................... 333/24 R |
| 5,170,493 | 12/1992 | Roth ........................................ 455/82 |
| 5,200,718 | 4/1993 | Kato ....................................... 333/25 |
| 5,283,637 | 2/1994 | Goolcharan ............................... 348/17 |
| 5,420,551 | 5/1995 | Conte et al. .............................. 333/12 |

*Primary Examiner*—Robert Pascal
*Attorney, Agent, or Firm*—Patterson, Thuente, Skaar & Christensen, P.A.

[57] ABSTRACT

Disclosed is a passive, highly efficient, low noise coupling device that includes a balun and noise reduction circuitry uniquely configured for converting an unbalanced video signal on a 75 ohm transmission line or connector to a balanced signal on a 100 ohm transmission line or connector and vice versa. The device efficiently allows use of a 100 ohm unshielded twisted pair, such as a conventional telephone cable, for multiplex transmission of video signals or the like in the frequency range of 50 to 500 megahertz. The preferred embodiment has a circuit board with a 75 ohm unbalanced side and a 100 ohm balanced side separated by a balun having a toroid core with a very high permeability. A common mode choke for noise rejection is inserted in the balanced side. A common mode toroid shunt on the device's balanced side provides further noise reduction. An isolation transformer in the device can provide personnel protection and eliminate ground loops. Circuit board traces connecting the components are impedance matched to either the balanced side or the unbalanced side as appropriate.

21 Claims, 8 Drawing Sheets

_Fig.8A._

_Fig.8B._

_Fig.8C._

COUPLING DEVICE CONNECTING AN UNBALANCED SIGNAL LINE TO A BALANCED SIGNAL LINE

This application is a continuation-in-part of application Ser. No. 08/574,494, filed Dec. 19, 1995, which will issue as U.S. Pat. No. 5,633,614 on May 27, 1997. Application Ser. No. 08/574,494 was a continuation of application Ser. No. 08/358,739, filed Dec. 19, 1994, now U.S. Pat. No. 5,495,212.

BACKGROUND OF THE INVENTION

The invention relates to transmission systems for video signals. More specifically the invention relates to low noise coupling devices to couple a shielded unbalanced video signal wiring to a balanced unshielded wiring.

Cable television (CATV) is transmitted over 75 ohm coaxial cable. Channels 2 through 60 are transmitted on the cable at frequencies ranging from 50 to 500 megahertz. Many homes and commercial buildings have previously installed telephone cable consisting of unshielded twisted pairs. Standard unshielded twisted pairs (UTP) of telephone cable have a characteristic impedance in the range of 100 ohms. Moreover, standard computer network wiring has a 100 ohm characteristic impedance which is used for telephone transmission as well. On occasion it is desirable to utilize cables of such types for transmission of video signals, this is especially true where standard cable television cable has not been installed or the cost differential to install UTP versus coaxial cable is significant.

There are difficulties associated with using the unshielded twisted pair (UTP) cable. First, the transmission through standard CATV coaxial cable is unbalanced. Any attempt to utilize the UTP cable with unbalanced signals will result in unacceptable radiation and attenuation of the CATV signals. Conventional techniques of matching and balancing the cables do not offer optimal performance across the broad frequency range utilized by CATV signals. Less than optimal matching can dramatically shorten the length of UTP cable that can be used to transmit such video signals without amplification.

Moreover, in that UTP is unshielded it is much more susceptible to noise or other RF interference. Conventional noise reduction techniques or devices are either not effective across the broad CATV frequency spectrum, are overly complex, and/or tend to cause excessive attenuation to the video signals.

SUMMARY OF THE INVENTION

Disclosed is a passive, highly efficient, low noise coupling device that includes a balun and noise reduction circuitry uniquely configured for converting an unbalanced video signal on a 75 ohm transmission line or connector to a balanced signal on a 100 ohm transmission line or connector and vice versa. The device efficiently allows use of a 100 ohm unshielded twisted pair, such as a telephone cable, for multiplex transmission of video signals in the frequency range of 50 to 500 megahertz. The typical utilization will have a first coupling device connected between the 75 ohm cable carrying the CATV signal and the beginning of the UTP cable and a second coupling device connected at the other end of the UTP cable to convert back to a 75 ohm unbalanced signal for input into the television receiver or other video device.

A preferred embodiment has a circuit board with a 75 ohm unbalanced side and a 100 ohm balanced side separated by a balun having a toroid core with a very high permeability. A common mode choke for noise rejection is inserted in the balanced side. The choke has a dual toroid core, one core of high permeability and one of low permeability, and has windings with a 100 ohm characteristic impedance. A common mode toroid shunt on the device's balanced side provides further noise reduction. Circuit board traces connecting the components are impedance matched to either the balanced side or the unbalanced side as appropriate. Preferred embodiments may utilize a balun with a tri-bifilar winding and isolation transformers.

A feature and advantage of the invention is that the device permits efficient use of UTP cable to carry CATV signals or the like. A further advantage is that the invention accomplishes said use passively.

A feature and advantage of the invention is that the device provides excellent noise reduction characteristics over the broad frequency range associated with CATV.

A feature and advantage of the invention is that two of the units described can be used at each end of the section of UTP wire. That is one of the devices can be utilized to couple between the 75 ohm unbalanced line and the 100 ohm balanced line and an addition identical device can also be used to couple the 100 ohm balanced line and the 75 ohm unbalanced line at the video device.

DETAILED DESCRIPTION OF THE PREFERRED EMBODIMENTS

Figure 1:
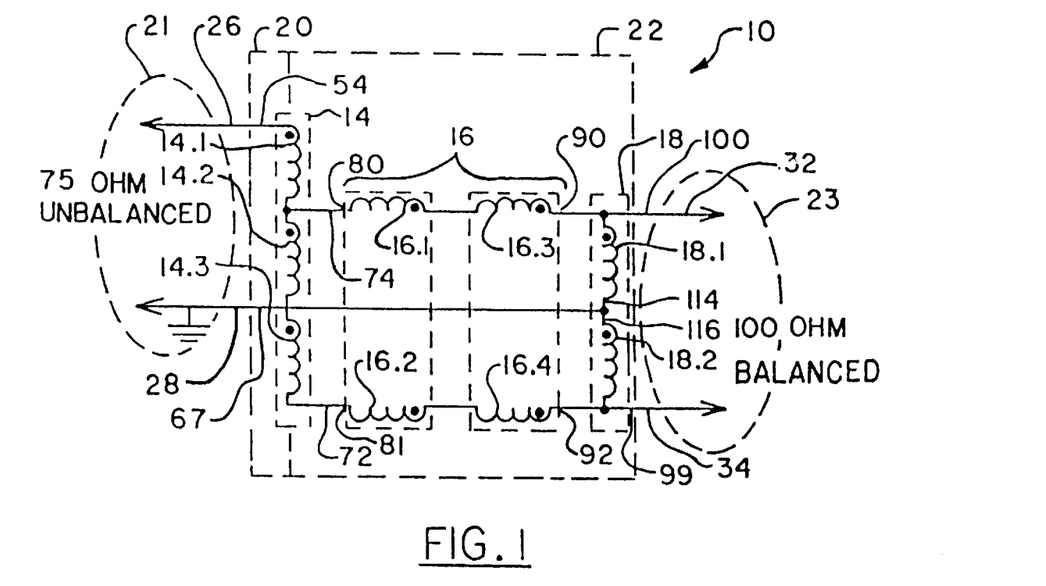
FIG. 1 is a schematic diagram of the invention.

Referring to FIG. 1, a schematic of the preferred embodiment of the invention is depicted with the device generally indicated with the numeral 10. The device 10 is inserted between an unbalanced signal line with a first characteristic impedance of 75 ohms and a balanced line with a second characteristic impedance of 100 ohms. The device 10 is principally comprised of a balun 14, with three sets of windings 14.1, 14.2, 14.3, a choke 16, with four sets of windings 16.1, 16.2, 16.3, 16.4 and a common mode shunt 18 with two sets of windings 18.1, 18.2, on the FIG. 1 schematic. The device can be characterized as having an unbalanced side 20 and a balance side 22 which are separated by the balun 14. The unbalanced side 20 of the device is connectable through an unbalanced side port 21 to a signal line having the first characteristic impedance such as a 75 ohm coaxial cable. The balanced side 22 of the device is connectable through a balanced side port 23 to a balanced line such as a 100 ohm unshielded, twisted pair UTP.

Figure 2:
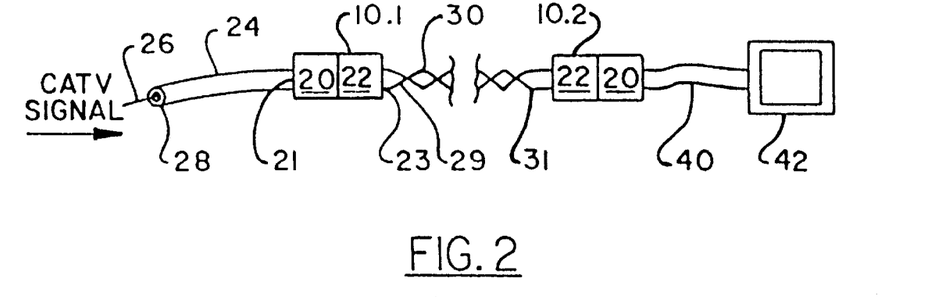
FIG. 2 is a block diagram of an application of the invention utilizing two of the described devices.

Referring to FIG. 2, one application of the invention is shown. The coaxial cable 24 comprised of an inner conduit 26 carrying a CATV or like signal between a grounded outer conductor shield 28 connected to the unbalanced side 20 of a first device 10.1, and the balanced side 22 of said device 10.1 is connected to a first end 29 of the unshielded twisted pair (UTP) cable 30. The opposite end or second end 31 of the UTP 30 is connected to the balanced side 22 of a second identical device 10.2. The unbalanced side 20 of said device 10 connected by way of coaxial cable 40 or other suitable connector directly to the end video device 42 such as a television receiver.

Figure 3:
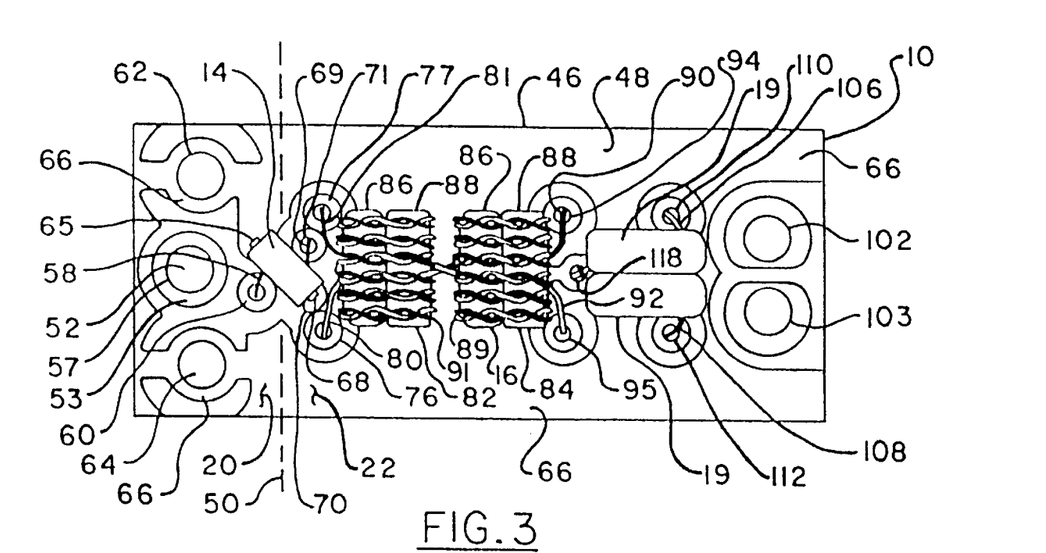
FIG. 3 is a top plan view of the device.
Figure 4:
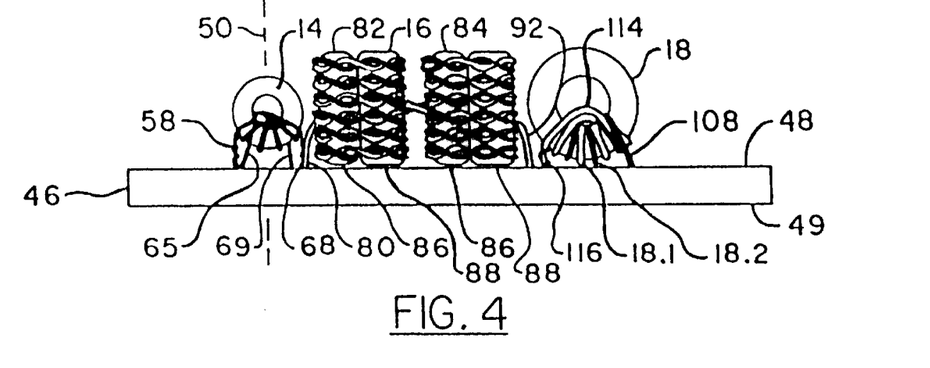
FIG. 4 is a side elevational view of the invention.
Figure 5:
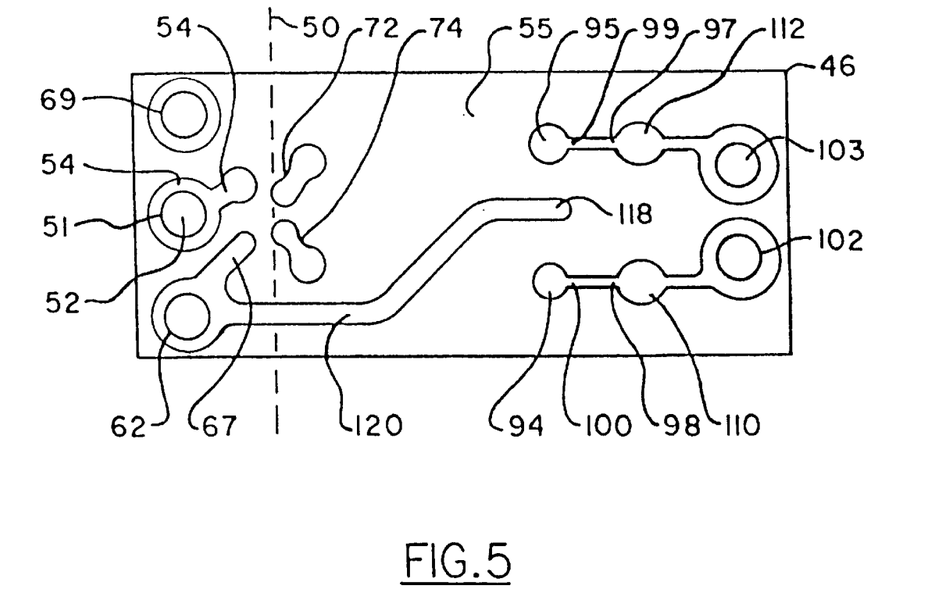
FIG. 5 is a bottom plan view of the circuit board for the device.

Referring to FIGS. 3, 4 and 5, a top plan view, a side elevational view, and bottom plan view of a suitable embodiment of the device 10 is shown. A circuit board 46 is utilized for mounting and supporting the principal components, the balun 14, the choke 16, and the shunt 18. The circuit board may be conventionally manufactured of epoxy fiberglass material such as FR4. The board has a top side 48 and a bottom side 49 with copper cladding on both sides. The unbalanced side 20 and the balanced side 22 are shown generally separated by the balun 14 and dashed line 50. The unbalanced side 20 has a terminal junction 51 including a hole 52 extending through the board 46 and a trace 54 encircling said hole. The terminal junction 51 connects to the balun 14 via a first input signal line 54 on the bottom side 55, shown in FIG. 5. Said first input signal line 54 is connected to the balun 14 at the first input lead 58 to the balun 14 by way of terminal junction 60. The unbalanced side 20 of the device 10 also has two terminal junctions 62, 64 for connection to the outer shielded conductor 28. Said terminal junctions 62, 64 are connected to a ground trace 66 which extends across the length of the top side 48 of the board 46 and generally surrounds each of the various other terminal junctions. The terminal junctions 62, 64 that connect to the outer shielded conductor are electrically connected to the balun 14 at a second balun input lead 65 by way of a second input signal line 67 shown as a trace on the bottom side 49 of the board 46. The balun 14 has two output leads 68, 69 which are respectively connected to terminal junctions 70, 71. The terminal junctions 70, 71 are connected to balun output traces 72, 74 located on the bottom of the board 46. The balun output traces 72, 74 connect to terminal junctions 76, 77 which are soldered to the pair of input ends 80, 81 of the choke 16. The balun 14 may have a toroid core with a permeability of at least 1000.

The choke 16 as shown is comprised of two sets of toroid core pairs 82, 84. Each set of toroid core pairs 82, 84 is comprised of a ferrite first toroid core 86 of very high permeability and a powdered iron second toroid core 88 of relatively low permeability. Suitably, the first ferrite core will have a permeability at least 4000 greater than the second powdered iron core. Appropriate permeability would be 10,000 for the ferrite core and 35 for the powered iron core. The high perm core provides more attenuation of low frequency noise whereas the low permeability core provides more efficient attenuation in the high frequency range. As shown in FIG. 3, the windings 16.1, 16.2, 16.3, 16.4 on said pairs of toroid cores consists of a single pair of wires 89, 91 twisted together, one of which is shown in outline 89 and the other shown in solid 91, before they are wound on each of the pairs of toroid core 82, 84. Each of the wires 89, 91 has a conductor portion and an insulation portion. The conductor portion and insulation portion are appropriately sized and the insulation portion material is suitably selected to give the twisted pair substantially a 100 ohm characteristic impedance matching the second characteristic impedance. The applicant has found that 34 gauge wire with a 0.0095 inches of Teflon™ insulation provides for the appropriate characteristic impedance for the twisted pair of windings 16.1, 16.2, 16.3, 16.4. The pair of twisted wires 89, 91 may have 10 turns of 34 AWG wire on each of the pairs 82, 84 of cores.

Opposite the input ends 80, 81 of the choke are the choke output ends 90, 92 which are soldered to terminal junctions 94, 95. The terminal junctions 94, 95 are connected to traces 97, 98 which function as output signal lines 99, 100 and which connect to the output terminal junctions 102, 103.

Straddling the output signal lines 99, 100 is the common mode shunt 18. The common mode shunt 18 has a first winding 18.1 and a second winding 18.2 which are shown in FIG. 4 in outline and in solid respectively. The windings 18.1, 18.2 respectively have a first winding lead 106 and a second winding lead 108 connected to two terminal junctions 110, 112. The two windings 18.1, 18.2 also have a first winding grounding lead 114 and a second winding grounding lead 116 which are both soldered to terminal junction 118. Said junction 118 is connected to a trace 120 on the bottom side 49 of the board 46 which goes to terminal junction 62 which is connected to the grounded trace 66. The first winding and the second winding each may suitably have six turns on the toroid core. As depicted, the toroid core has dual cores. Both cores suitably are powdered iron cores with a permeability of 35.

The device operates as follows: Referring to FIG. 2. two of the devices 10.1, 10.2 may be inserted on each end 29, 31 of the UTP cable 30. The unbalanced sides 20 of each device are conventionally connected to the shielded CATV signal carrying cable 24 and the cable 40 or connector attached to the television receiver 42 or other video device. The balanced sides 22 of each device are conventionally connected to each end 29, 31 of the UTP cable 30. Referring to FIG. 1, the balun 14 is configured to balance the unbalanced signals. The number of turns of first winding 14.1 plus the second winding 14.2 to the second winding 14.2 plus the third winding 14.3 is 9:10 which substantially provides an increase in the characteristic impedance from 75 to 100 ohms.

The balanced signal leaving the balun 14 is transmitted by way of the balun output signal lines which are comprised of the traces 72, 74 on the bottom side of the circuit board 46.

The traces 72, 74 are suitably configured and spaced to maintain the 100 ohm impedance. The balanced signal then enters the choke 16 in which the windings 16.1, 16.2, 16.3, 16.4 are wound to provide a very high impedance to any unbalanced signals which would be characteristic of noise, and a very low impedance to the balanced signals. The dual core arrangement provides a wide band of noise attenuation. The use of two sets of pairs of cores distances the input and output of the choke and provides for minimal capacitive coupling. The balanced and noise reduced signal then exits the output ends 90, 92 of the choke and are connected to the output signal lines 99, 100 which are comprised of the traces 97, 98 on the bottom side 55 of the board. The common mode shunt 18 is connected across the output signal lines 99, 100. The shunt 18 has the two windings 19.1, 19.2 configured such that any unbalanced signals sees a very low impedance to ground, and the balanced signals see a very high impedance to ground.

The common mode choke 16 and common mode shunt 18 effectively minimize any extraneous incident noise on the 75 ohm cable. Moreover they operate to isolate the 75 ohm cable from any unbalanced noise from the 100 ohm cable.

The output signal devices 99, 100 are suitably connected to the existing UTP cable. At the opposite end of the UTP cable an additional second device 10 is connected to the UTP cable at the balanced side terminal junctions of the second device. The CATV signal then enters and passes through the second device in a reverse fashion from what was previously described. However, the components function in like manner. Any noise which was picked up on the UTP cable is rejected or shunted to ground through the common mode choke 16 and common mode shunt 18. The balanced signal is converted into an unbalanced signal by way of the balun and further is converted to 75 ohms. The 75 ohms is then connected to a cable or suitable connector for connection to the television receiver or other video device.

The use of "input" and "output" as used herein with reference to components is a matter of convention for differentiating the leads on the components and does not indicate that the signals must be transmitted in a particular direction through the device or component. As described above, and with reference to FIGS. 1 and 2, the CATV signals enter the second device 10.2 at the output signal lines 99, 100 and exit at the input signal lines 54, 67.

Referring to FIGS. 7A, 7B, 7C, 8A, 8B, 8C, 9A, 9B, 9C, 9D, 10A, 10B, 11, 12A, 12B, and 13, several variants of the invention as disclosed above are provided. The individual components as presented may be of the configurations previously described or as described below. The construction of the magnetic components will only be described in detail in the first variant.

Figure 6:
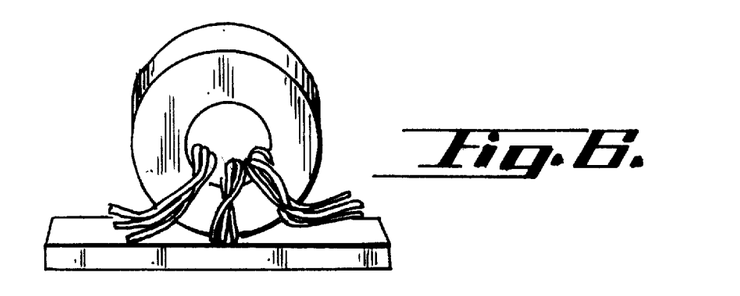
FIG. 6 is a perspective view of the balun.
Figure 7A:
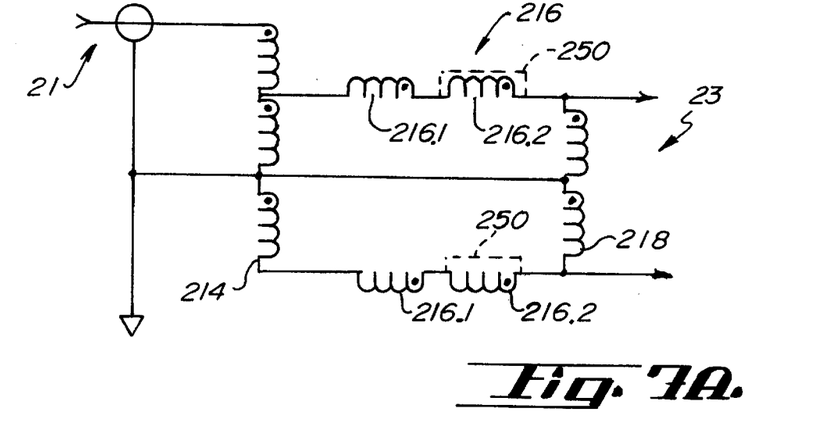
FIG. 7A is a schematic view of the alternate embodiment of the invention.

Referring to FIG. 7A, this is the basic component orientation as shown in FIG. 1. The balun 214 in this embodiment uses a tri-bifilar winding shown in perspective in FIG. 6. The windings may be fabricated, first taking two strands of 40 AWG HPN magnet wire, twisted to 8 TPI. This is done for three sets of wires, such as red, green, and natural colors for purposes of explanation. After the three individual colors are twisted, the resultant three twisted strands are then twisted together to approximately 5 TPI. The balun 214 is then wound for three turns of the twisted bundle, the green wire "threaded out," and the natural and red wires wound for one additional turn. The green "start" is twisted to the natural "finish" on the start end. The green "finish" is twisted to the natural "start" on the finish end. In this embodiment, both the common mode chokes 216.1, 216.2 and the common mode shunt 218 are wound using 36 AWG TFE insulated wire, with an insulation thickness of 1.25 mil and twisted to 10 TPI, providing a characteristic transmission line impedance of 100 ohms. The common mode choke pair 216 consists of individual chokes 216.1 and 216.2. The first choke 216.1 consisting of a ferrite core and a powdered iron core are stacked and wound with eight turns of the twisted TFE (Teflon™ insulated) wire. The second choke 216.2 consisting of two powdered iron cores are stacked and wound with eight turns of the twisted TFE wire. The common mode shunt 218 is comprised of a ferrite and a powdered iron core stacked with a bifilar winding of eight turns of the TFE wire.

This configuration has demonstrated an effective operating frequency range 1 MHz to 750 MHz.

Figure 7B:
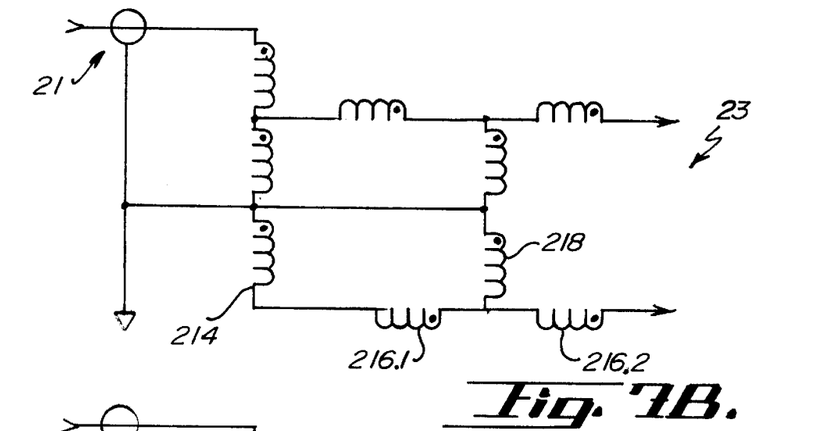
FIG. 7B is a schematic view of the alternate embodiment of the invention.
Figure 7C:
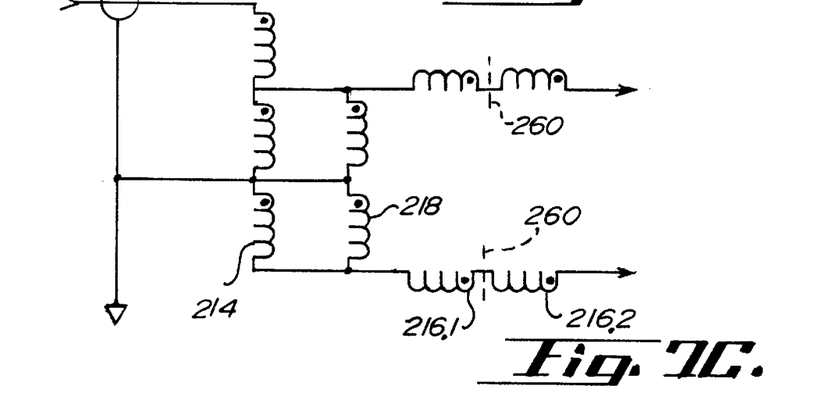
FIG. 7C is a schematic view of the alternate embodiment of the invention.

FIGS. 7B and 7C are the designs of FIG. 7A with the common mode shunt between the choke pair and after the balun.

Figure 8A:
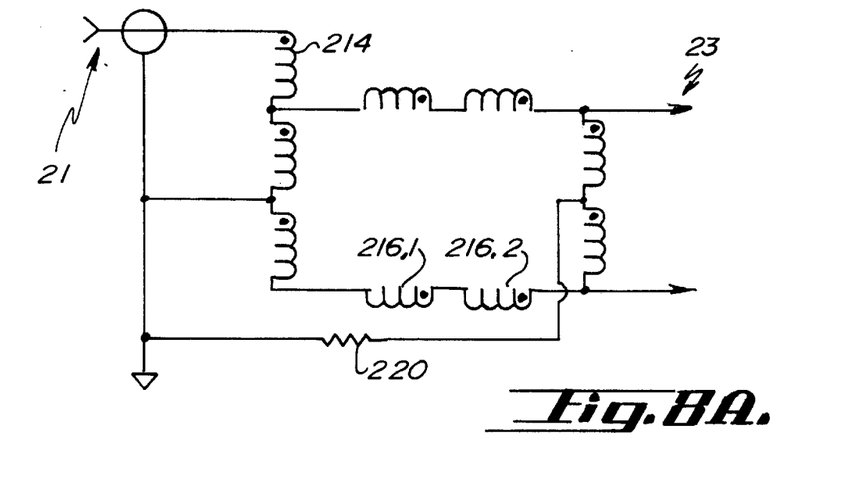
FIG. 8A is a schematic view of the alternate embodiment of the invention.
Figure 8B:
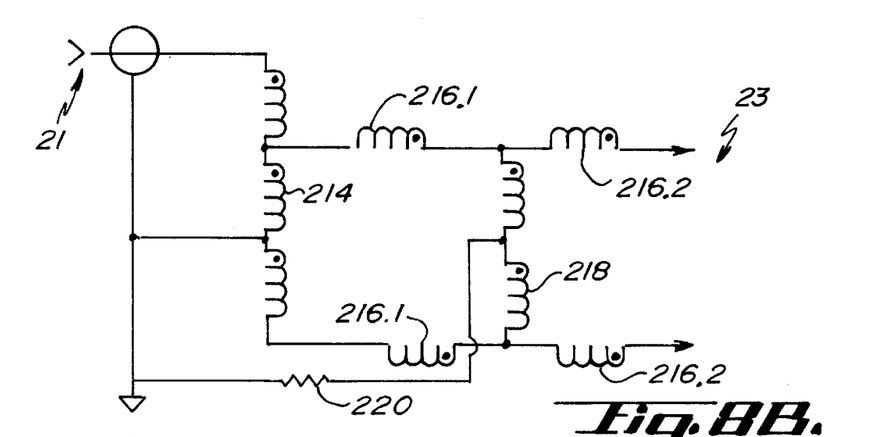
FIG. 8B is a schematic view of the alternate embodiment of the invention.
Figure 8C:
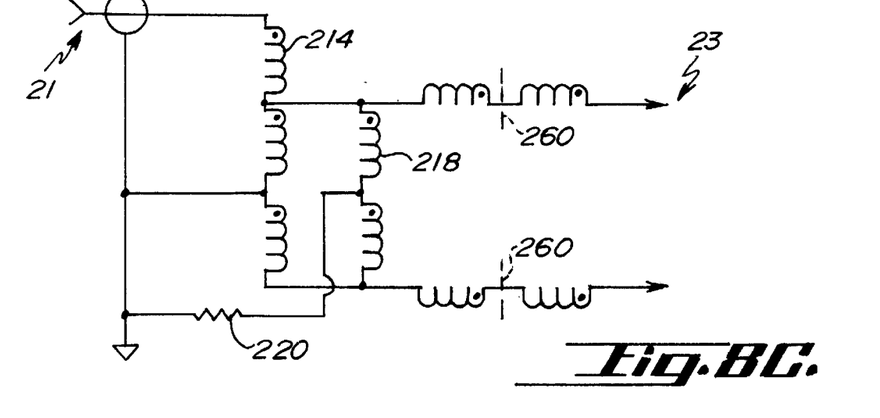
FIG. 8C is a schematic view of the alternate embodiment of the invention.

Referring to FIGS. 8A, 8B, and 8C, these embodiments add a terminating impedance to the common mode shunt by a component designated 220 at the center tap of the common mode shunt. This operates to terminate the common mode noise which is absorbed by the impedance component 220 and is dissipated as heat.

Figure 9A:
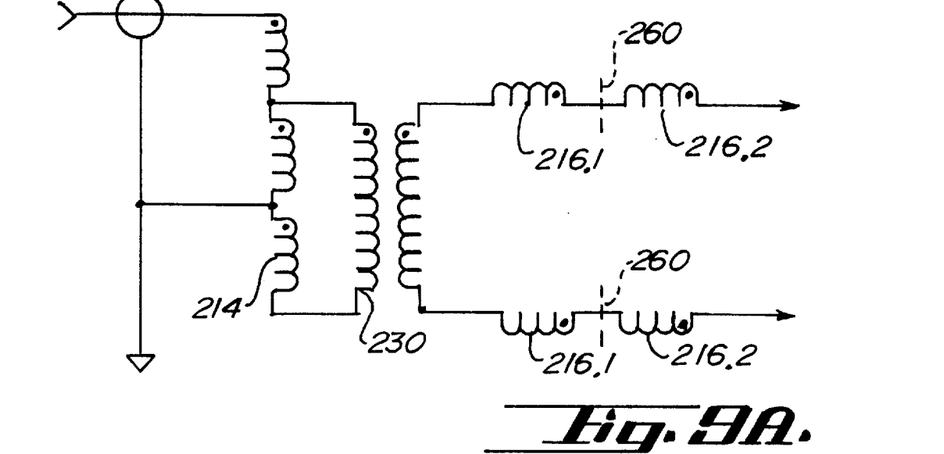
FIG. 9A is a schematic view of the alternate embodiment of the invention.
Figure 9B:
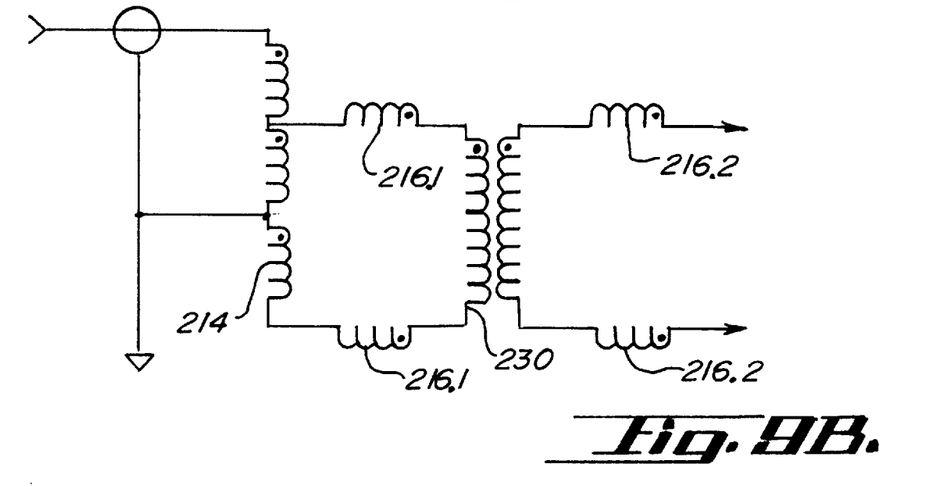
FIG. 9B is a schematic view of the alternate embodiment of the invention.
Figure 9C:
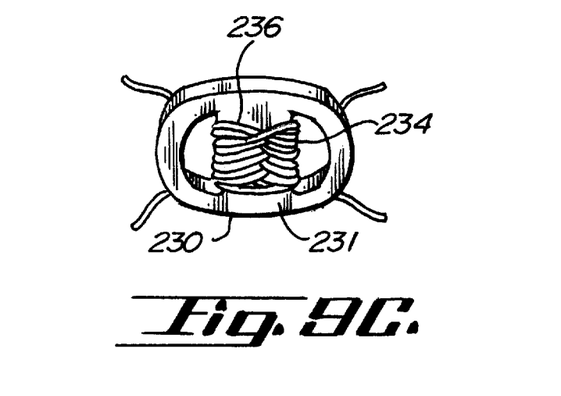
FIG. 9C is a perspective view of the isolation transformer.
Figure 9D:
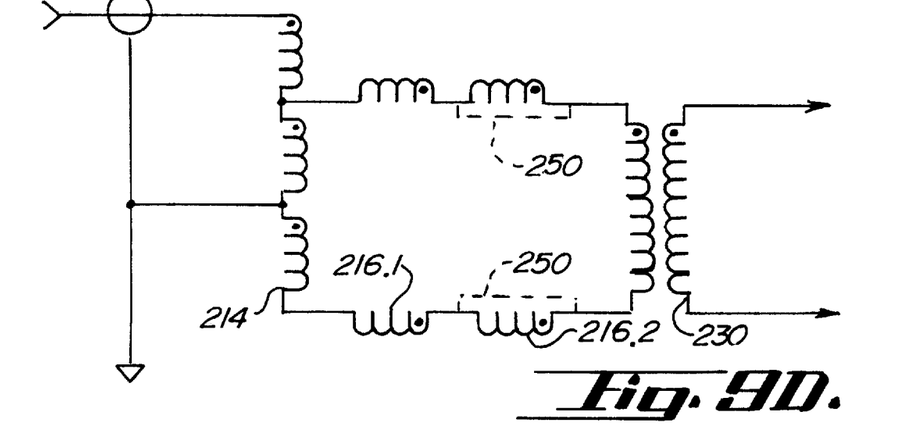
FIG. 9D is a schematic view of an alternate embodiment of the invention.

Referring to FIGS. 9A, 9B and 9C, these embodiments remove the common mode shunt and add galvanic isolation by an isolation transformer 230. Common mode signals are generally discussed with respect to earth ground. If no earth ground reference is present in the circuit, no voltage differential can occur; and the common mode signal is no longer present. A common mode signal is one that has equal amplitude and phase on two or more conductors. For a transformer to "work" or pass a signal from one winding to another, the transformer must be excited with a voltage across one winding. If a signal with equal voltage and phase is presented across any two nodes, there is no voltage differential and excitation cannot occur. With no excitation, the signal can only be passed via the interwinding capacitance within the transformer. Having an isolation transformer in the circuit, no earth ground reference is introduced in the cable side of the circuit; therefore, any common mode signal is of reduced concern. Furthermore, this noise can only pass through the circuit via the internal capacitance, which in the design of the isolation transformer is very minimal. The isolation transformer 230 is comprised of a double aperture ferrite core 231 having an initial permeability of 850. The wire 234 used in the construction of this transformer is five strands of 42 AWG HPN natural magnet wire and five strands of 42 AWG HPN red magnet wire, all twisted to approximately 8 TPI. Through rather extensive experimentation this configuration was found to provide optimum balance of interwinding capacitance and leakage inductance. The transformer 230 is wound with eight turns around the bridge 236 of the core. After winding, the ends are untwisted and manually separated into their respective color groups. This configuration provides better than 250 VAC isolation, less than 2 dB of insertion loss from 10 MHz to 500 MHz, and better than 15 dB return loss from 10 MHz to 500 MHz. Typical interwinding capacitance is 6 pF. An additional benefit of isolation to the cable side interface is the lack of ground reference between the balanced (cable) side and the unbalanced (coax) side, in theory, greatly improving signal balance and reducing radiation or emissions. In the embodiment of FIG. 9A the isolation transformer is placed between the balun and the common mode choke.

The addition of this isolation transformer gives several very real benefits: 1) elimination of "ground loops" or voltage potentials from one earth ground point to another. Over long distances, this could be as low as a few tens of millivolts up to several volts, depending on the situation. This cannot only be a serious problem as far as noise is concerned but also a potential for equipment damage if high enough; 2) improves signal balance on the twisted pair cable, greatly reducing emissions due to initial signal imbalance; 3) voltage isolation. In the event that the cable jacket would be punctured and make contact with an AC power feeder line without voltage isolation at the very least the balun units would be destroyed and more than likely the equipment they were attached to. More threatening is the possibility of personal injury. The reverse is also true in that an equipment malfunction placing a dangerous voltage on the cable would pose a similar threat, eliminated by the isolation. The isolation is sufficient to withstand a 60 second application of 240 VRMS on one part.

Figure 10A:
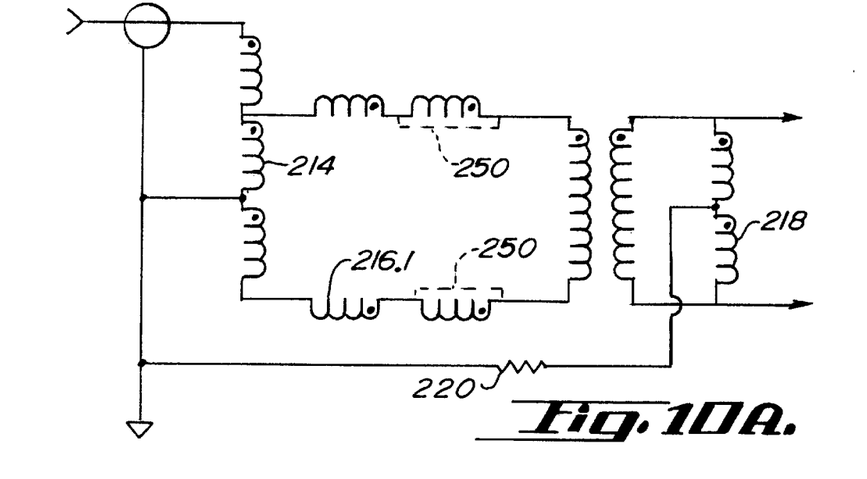
FIG. 10A is a schematic view of an alternate embodiment of the invention.
Figure 10B:
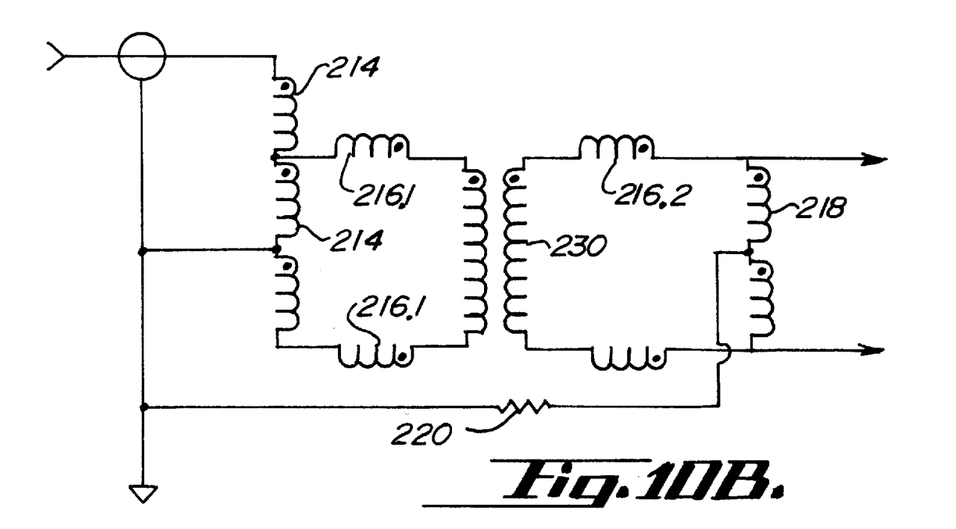
FIG. 10B is a schematic view of an alternate embodiment of the invention.

Referring to FIGS. 10A and 10B, these embodiments have addition of the common mode shunt with the impedance termination 220 on the end of the cable side. This adds the benefit of terminating common mode signals.

Figure 11:
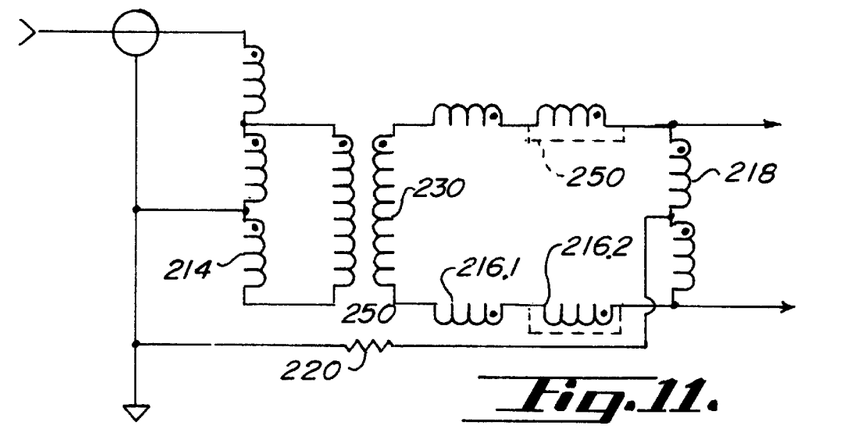
FIG. 11 is a schematic view of an alternate embodiment of the invention.

Referring to FIG. 11, this embodiment is again similar to the embodiments of FIGS. 10A and 10B with the placement of the isolation transformer. For the same reasons as the embodiments of FIGS. 9A, 9B and 9C, the applicants believe this is most desirable between the embodiments of FIGS. 10A, 10B and 11.

Figure 12A:
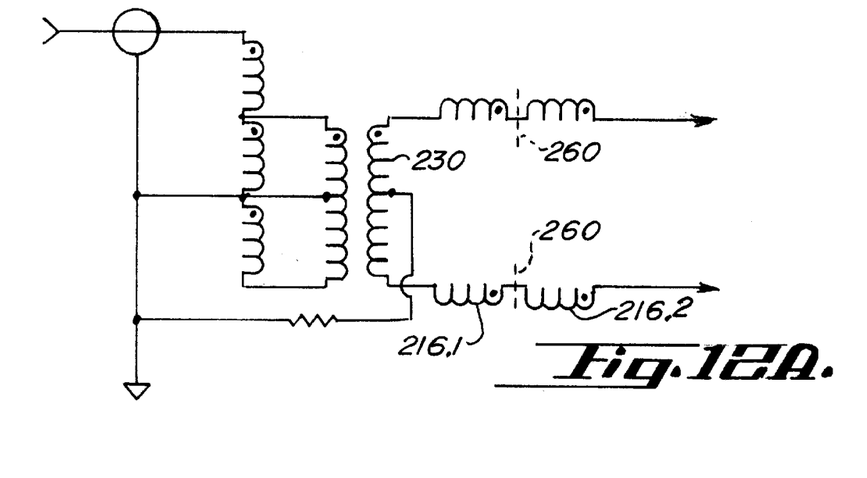
FIG. 12A is a schematic view of an alternate embodiment of the invention.
Figure 12B:
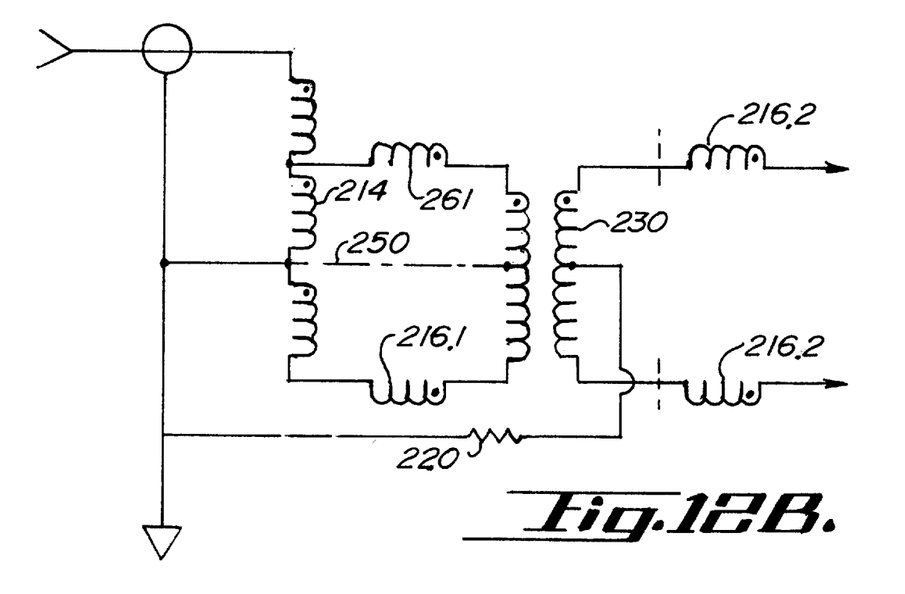
FIG. 12B is a schematic view of an alternate embodiment of the invention.

Referring to FIGS. 12A and 12B, these embodiments combine the function of the common mode shunt and isolation transformer into one component. The secondary and primary windings of the isolation transformer is center tapped, essentially creating a common mode shunt within it. Again, it is resistive/capacitively terminated to earth ground. The optional connection 250 of the impedance matching transformer may improve signal balance.

Figure 13:
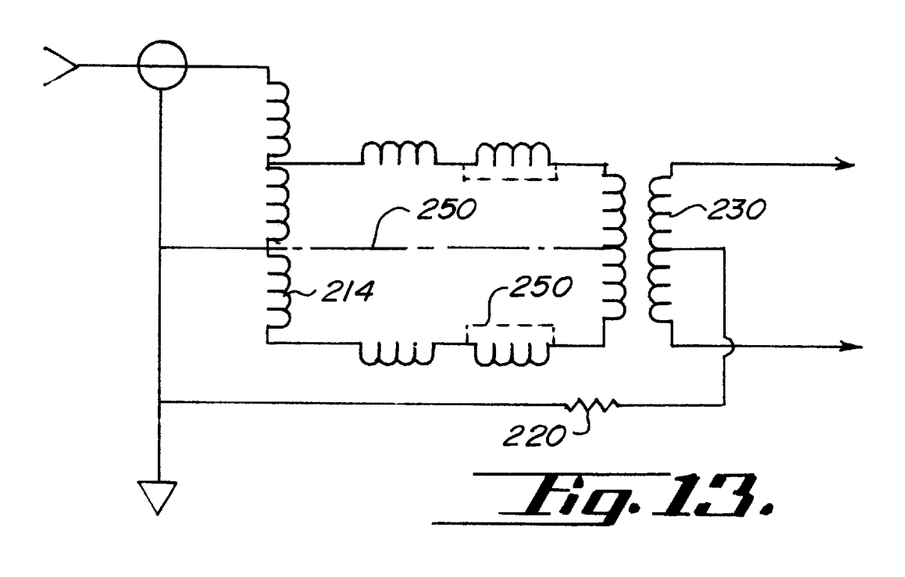
FIG. 13 is a schematic view of an alternate embodiment of the invention.

Referring to FIG. 13, in this embodiment the isolation/common mode shunt transformer is moved to a position opposite the balun.

In the embodiments incorporating the "common mode terminating impedance component 220," with various effects on AC and DC coupling, the impedance could be one of 1) resistor only (DC and AC coupled); 2) capacitor (AC coupled); or 3) resistor and capacitor (AC coupled). The impedance selected would represent the common mode impedance of the cable itself and realistically could be from 10 to 100 Ohms. If a capacitor alone is used, its value could be chosen to have a very high impedance at low frequencies (100 kHz and below) but develop impedance as the frequency rises.

The dashed lines designated 250 on the figures indicate alternate circuit paths to illustrate additional embodiments. For example, in FIG. 9D, the dashed line 250 represents the deletion of the second common mode choke 216.2. The dashed lines 260 shown in FIGS. 7C, 8C, 9A, 12A, and 12B indicate an alternate embodiment by showing an alternate position for the output port thus eliminating the final component.

The present invention may be embodied in other specific forms without departing from the spirit or essential attributes thereof, and it is therefore desired that the present embodiment be considered in all aspects as illustrative and not restrictive, reference being made to the appended claims rather than to the foregoing description to indicate the scope of the invention.

What is claimed:

1. A coupling device for connection between an unbalanced signal line having a first characteristic impedance and a balanced signal line having a second characteristic impedance, the unbalanced signal line including a grounded conductor, the coupling device comprising:

a) an input for connection to the unbalanced signal line and an output port for connection to the balanced signal line;

b) a balun comprised of a pair of balun input leads at the input port, a pair of balun output leads, a tri-bifilar winding, and a core, the input leads electrically connected to the unbalanced signal line, the balun configured for matching the first characteristic impedance to the second characteristic impedance and for providing a substantially balanced signal at the output leads;

c) a first common mode choke and a common mode shunt connected between the balun output leads and the second port, the common mode choke comprised of a core, a pair of windings, a pair of input ends, and a pair of output ends, and the common mode shunt comprised of a core, a first winding with a first winding lead and an opposite first winding grounded lead, and a second winding with a second winding lead and an opposite second winding grounded lead, the first winding grounded lead and the second winding grounded lead electrically connected to the grounded conductor.

2. The coupling device of claim 1, wherein the common mode choke is connected intermediate the balun and the common mode shunt.

3. The coupling device of claim 1, wherein the common mode shunt is connected intermediate between the balun and the common mode choke.

4. The device of claim 3, further comprising a second common mode choke connected between the first common mode choke and the common mode shunt.

5. The device of claim 2, further comprising a second common mode choke intermediate the second port and the common mode shunt.

6. The device of claim 1, wherein the common mode shunt has a center tap that is grounded through an impedance component.

7. The device of claim 1, further comprising an isolation transformer connected intermediate the balun and the output port.

8. A coupling device for connection between an unbalanced signal line having a first characteristic impedance and a balanced signal line having a second characteristic impedance, the unbalanced signal line including a grounded conductor, the balanced signal line comprising a twisted pair of wires, the coupling device comprising:

a) an input port connectable to the unbalanced signal line and an output port connectable to the balanced signal line;

b) a balun comprised of a pair of balun input leads, a pair of balun output leads, the input leads electrically connected to the input port, the balun configured for matching the first characteristic impedance to the second characteristic impedance and for providing a balanced signal at the output leads;

c) a common mode choke and a common mode shunt connected intermediate the balun output leads and the output port, the common mode choke comprised of a core, a pair of windings having a pair of input ends and a pair of output ends, the input ends of the windings electrically connected to the balun output leads and the pair of output ends electrically connected to the balanced signal line by a pair of output signal lines; and d) the common mode shunt comprised of a core, first winding with a first winding lead and an opposite first winding grounded lead, and a second winding with a second winding lead and an opposite second winding grounded lead, the first winding grounded lead and the second winding grounded lead electrically connectable to the grounded conductor thru the input port, the first winding lead and second winding lead connected to the output signal lines.

9. The device of claim 8 further comprising an isolation transformer inserted and electrically connected intermediate the balun output leads and the output port.

10. The device of claim 9, wherein the balun is comprised of tri-bifilar windings.

11. The device of claim 9 further comprising a circuit board, the circuit board having signal line traces suitably configured and spaced to maintain the second characteristic impedance.

12. The device of claim 9 wherein the pair of windings of the common mode choke each comprises a conductor portion and an insulation portion, each conductor portion and each insulation portion configured so that the pair of windings has a characteristic impedance substantially matching the second characteristic impedance.

13. The device of claim 9 wherein the common mode choke further comprises a pair of toroid cores, the toroid cores having substantially different permeability from one another.

14. The device of claim 9, wherein the balun is comprised of three twisted pairs of wire and a toroid core, the three twisted pairs twisted together forming a tri-bifilar winding, the tri-bifilar winding wound on the toroid core.

15. The device of claim 9, wherein each pair of windings of the common mode choke and the common mode shunt each have conductor portions and insulation portions, each of said conductor portions and insulation portions configured to maintain the second characteristic impedance.

16. The device of claim 9, wherein the common mode shunt has a center tap and the center tap is connected to ground.

17. The device of claim 16, wherein the center tap is connected to ground through an impedance in the range of 10–100 ohms.

18. A coupling device for connection between an unbalanced signal line having a first characteristic impedance and a balanced signal line having a second characteristic impedance, the unbalanced signal line including a grounded conductor, the balanced signal line comprising a twisted pair of wires, the coupling device comprising:

a) an input port connectable to the unbalanced signal line and a pair of signal lines connected to an output port connectable to the balanced signal line;

b) a balun comprised of a pair of balun input leads, a pair of balun output leads, the input leads electrically connected to the input port, the balun configured for matching the first characteristic impedance to the second characteristic impedance and for providing a balanced signal at the output leads;

c) a common mode choke inserted between the balun output leads and the output port, the common mode choke comprised of a pair of toroid cores and a pair of windings, each winding comprised of a conductor portion and an insulation portion, the windings twisted together such that each winding is in contact with the other winding by way of the insulation portion, the pair of toroid cores each having substantially different permeabilities from one another.

19. The device of claim 18, further comprising an isolation transformer placed electrically intermediate the balun and the output port.

20. The device of claim 18, wherein each conductor portion and each insulation portion of the windings of the common mode choke are configured to maintain the second characteristic impedance.

21. The device of claim 18, wherein the balun is comprised of a tri-bifilar windings.

* * * * *

UNITED STATES PATENT AND TRADEMARK OFFICE
CERTIFICATE OF CORRECTION

PATENT NO.    : 6,150,896
DATED         : November 21, 2000
INVENTOR(S)   : John E. DeCramer and Franklin Bradley Gass It is certified that error appears in the above-identified patent and that said Letters Patent is hereby corrected as shown below:

Drawing Sheet 8 of 8, consisting of Figures 12B and 13 should be deleted and replaced with the attached drawing sheet.

Column 2,
Line 23, "addition" should be -- additional --

Column 3,
Line 16, "balance" should be -- balanced --

Column 4,
Line 10, "powered" should be -- powdered --

Column 5,
Line 16, "sees" should be -- see --

Column 7,
Line 28, "this is most" should be -- this is the most --
Line 63, "aspects" should be -- respects --

Column 9,
Line 15, "balun" should be -- isolation transformer --
Line 16, "tri-bifilar windings" should be -- multiple strands of twisted wire. --

Signed and Sealed this

Twelfth Day of August, 2003

JAMES E. ROGAN
*Director of the United States Patent and Trademark Office*

Fig. 12B.

Fig. 13.